United States Patent [19]
Cha

[11] Patent Number: 5,723,993
[45] Date of Patent: Mar. 3, 1998

[54] PULSE GENERATING CIRCUIT FOR USE IN A SEMICONDUCTOR MEMORY DEVICE

[75] Inventor: Gi-Won Cha, Kyungki-do, Rep. of Korea

[73] Assignee: Samsung Electronics Co., Ltd., Suwon, Rep. of Korea

[21] Appl. No.: 662,323

[22] Filed: Jun. 12, 1996

[30] Foreign Application Priority Data

Jun. 12, 1995 [KR] Rep. of Korea ............... 15393/1995

[51] Int. Cl.[6] .................... H03K 5/153; H03K 5/00
[52] U.S. Cl. .................... 327/172; 327/166; 327/192; 327/551; 327/34; 327/165; 327/167; 327/176
[58] Field of Search ............................. 327/291, 293, 327/294, 261, 263, 172, 164, 175, 176, 165, 166, 167, 34, 551

[56] References Cited

FOREIGN PATENT DOCUMENTS 358111526A  7/1983  Japan ................... 327/172
363221709A  9/1988  Japan ................... 327/172

*Primary Examiner*—Timothy P. Callahan
*Assistant Examiner*—Dinh T. Le
*Attorney, Agent, or Firm*—Marger, Johnson, McCollom & Stolowitz, P.C.

[57] ABSTRACT

A pulse generating circuit for use in a semiconductor memory device is triggered by a transition of an input logic signal, to provide an output pulse having a predetermined pulse width or period. Feedback from the output pulse is used to isolate the input signal once the output pulse has begun, so as to prevent premature truncation of the output pulse if the input signal changes state during the output pulse period. This pulse generator is particularly advantageous in high-speed semiconductor memory integrated circuits where the input pulse may be relatively brief.

5 Claims, 5 Drawing Sheets

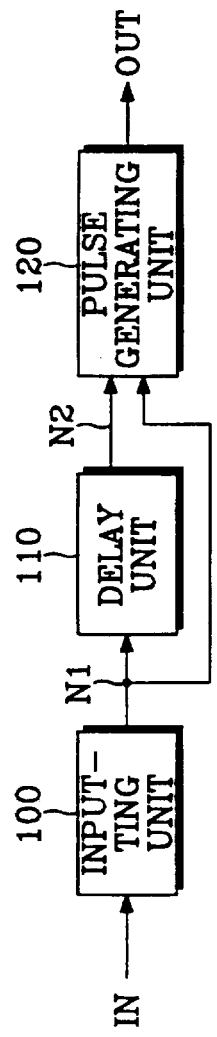
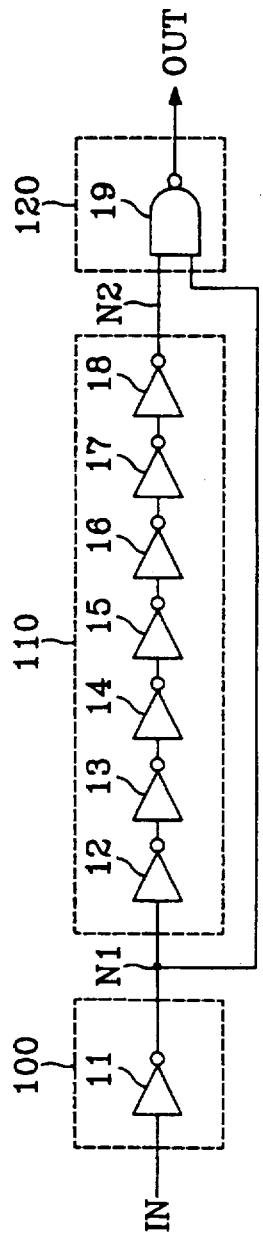
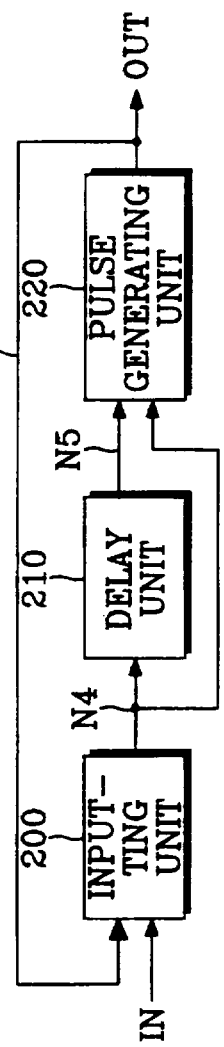

PULSE GENERATING CIRCUIT FOR USE IN A SEMICONDUCTOR MEMORY DEVICE

BACKGROUND OF THE INVENTION

1. Field of the Invention

The present invention relates to a pulse generating circuit for use in a semiconductor memory device, and more particularly pertains to an improved pulse generating circuit useful in a high-speed semiconductor memory device.

The present application is based on and claims priority from Korean Application No. 15393/1995 which is incorporated herein by reference for all purposes.

2. Description of the Related Art

In known semiconductor memory devices, many pulse signals of various pulse widths are utilized. To generate pulse signals, semiconductor memory devices are generally provided with a pulse generating circuit. As the operating speeds of various systems that utilize memory increase, increasingly high speed of operation of the semiconductor memory device is required as well. For example, the 33 MHz or 66 MHz clock frequencies common only months ago are now giving way to speeds well above 100 MHz. Accordingly, the periods of pulse signals (i.e. pulse width) generated in such devices are becoming increasingly short. However, in prior art pulse generator circuits, the width of an output pulse signal has been entirely determined by the time required for a state change of an input signal. As a result, as the width of the output pulse signal is further reduced, due to a reduction of the time required for a state change in the high speed semiconductor memory device, it is considerably difficult to provide an output pulse signal having the requested width.

FIG. 1 is a view illustrating a block diagram of a pulse generating circuit according to the prior art, and FIG. 2 is a circuit diagram of a pulse generating circuit according to one embodiment of FIG. 1. With reference to FIG. 1, an input terminal IN is connected to an input unit 100, and an output terminal of the input unit 100 is connected to the input terminal of a delay unit 110. An output terminal N2 of the delay unit 110, and a node N1 between the input unit 100 and the delay unit 110 are connected with two input terminals of a pulse generating unit 120. The output terminal of the pulse generating unit 120 is connected to an output terminal OUT of the system.

Referring now to FIG. 2, the input unit 100 shown in FIG. 1 is comprised of an inverter 11. The delay unit 110 is comprised of inverters 12 to 18, connected in series to one another, so that a delay time from input to output equals the inverter gate delay times the number of inverters, here seven. The pulse generating unit 120 is comprised of a NAND gate 19 having two input terminals connected with the node N1 and to the output terminal of the delay unit 110, respectively.

FIG. 5 is a waveform plot illustrating operation of the circuit of FIG. 2. Referring to FIGS. 1, 2 and 5, the pulse generating circuit according to the prior art will be described. For convenience, it is assumed that the logic gate delay time is 1 nanosecond (inverter and NAND gate) in this circuit.

An output pulse signal having a certain width is provided at the output terminal OUT, in response to a high-to-low transition of the input signal IN. This process is described as follows. When the input signal is initially "high", logic states of the input terminal IN, the node N1, the node N2 and the output terminal OUT are respectively "high", "low", "high" and "high". In this state, when the input terminal IN is changed to the "low" state, a signal which is inverted to the "high" state is output through the node N1 in 1 nanosecond, by passing through the inverter 11 of the input unit 100. Accordingly, the initial "high" signal is maintained at node N2 and the "high" signal of the node N1 is logic-gated in the NAND gate 19, thereby asserting a "low" signal through the output terminal OUT. However, as the signal at node N2 passes through the inverters 12 to 18 of the delay unit 110, the signal at node N2 is further delayed relative to node N1 by 7 nanoseconds. After that delay, the output signal of the node N2 becomes the "low" state. In other words, as shown in the waveform of FIG. 5, after an initial delay from the input signal by 2 nanoseconds, the output signal OUT exhibits a negative pulse signal having a width of 7 nanoseconds. This operation is illustrated in FIG. 5 "First Case".

However, in the pulse generating circuit according to the prior art as shown in FIG. 2, the width of the pulse signal output is determined by the width of the input signal IN if it is relatively short. Specifically, if the pulse width of the input signal is larger than the pulse width requested, an output pulse signal having the width requested can be obtained. But, as described above, as the memory device is required to have increasingly high speed operation, the period of the input signal is reduced. Where the period of the input signal is less than the period of the output pulse, the output pulse is truncated prematurely, as illustrated in FIG. 5 "Second Case". As a result, it is difficult to reliably generate pulses of predetermined width.

SUMMARY OF THE INVENTION

Accordingly, it is an object according to the present invention to provide a pulse generating circuit for generating a pulse signal having a predetermined width.

Another object of the invention is to generate a pulse signal having a width that is independent of the period of the input signal that triggers the output pulse.

According to one aspect of the invention, a pulse generating circuit for use in a semiconductor memory device includes an input unit for receiving an input logic signal to trigger an output pulse of predetermined pulse width in response to a first transition of the input logic signal. The input unit has an output terminal coupled to a first node of the circuit. A delay unit is coupled to the input unit to provide a predetermined delay period following a logic state transition at the first node. The delay unit preferably is formed of an odd plurality of inverters, and has an output terminal coupled to a pulse generating unit at a second node. The pulse generating unit coupled to the second node includes logic means for gating an output signal of said delay unit together with a logic signal at the first node, so as to generate an output pulse having a width corresponding to the predetermined delay period. The circuit further includes feedback means for coupling the output signal back to the input unit so as to inhibit a change of logic state at the first node, notwithstanding a change of logic state of the input logic signal, until after completion of the output pulse. This ensures that the output pulse signal always has a pulse width or period corresponding to the delay period.

According to another aspect of the invention, a switching and latch unit is provided for controllably coupling the first node to the pulse generating circuit in response to the pulse output signal so as to isolate the input unit from the pulse generating until after completion of the output pulse.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1 is a block diagram of a pulse generating circuit according to the prior art;

FIG. 2 is a circuit diagram of a pulse generating circuit according to one embodiment of the prior art;

FIG. 3 is a block diagram of a pulse generating circuit according to the present invention;

DETAILED DESCRIPTION OF THE PREFERRED EMBODIMENT

Referring now to FIG. 3, an input terminal IN is connected to an input unit 200, and an output terminal OUT of the pulse generating unit is connected via feedback path 230 to the other input terminal of the input unit 200. The output terminal of the input unit 200, i.e node N4, is connected to the input terminal of a delay unit 210. The output terminal of the delay unit 210 and node N4 are connected to two input terminals of the pulse generating unit 220, respectively. The output terminal of the pulse generating unit 220 is connected with the output terminal OUT of the pulse generating circuit according to the present invention.

Figure 4:
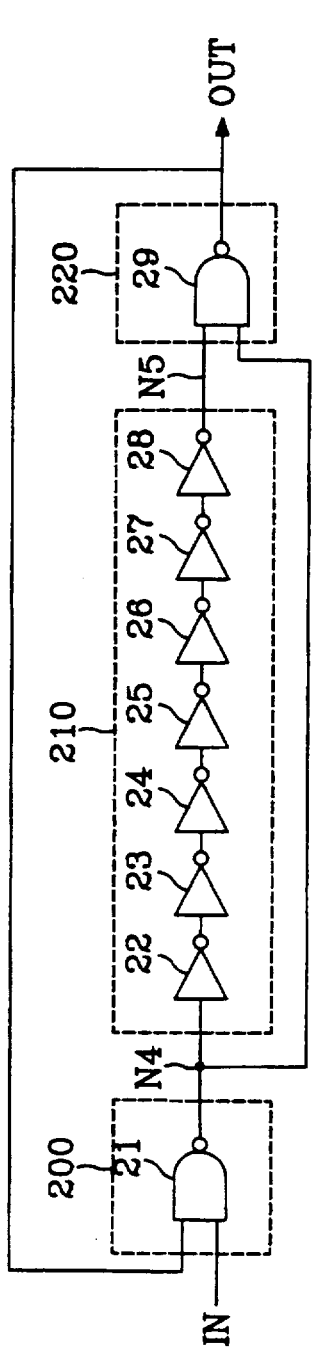
FIG. 4 is a circuit diagram of a pulse generating circuit according to one embodiment of the present invention.

Referring to FIG. 4, the input unit 200 corresponding to FIG. 3 is comprised of a NAND gate 21. The delay unit 210 is comprised of inverters 22–28 which are connected in series to one another. The pulse generating unit 220 is comprised of NAND gate 29 having two input terminals, to which the output terminal of the delay unit 210 is connected (N5) and to which a node N4 is connected. Further, it should be noted that the above described logic gates can be formed of alternative arrangements of gates, e.g. using DeMorgan's theorem.

Figure 6:
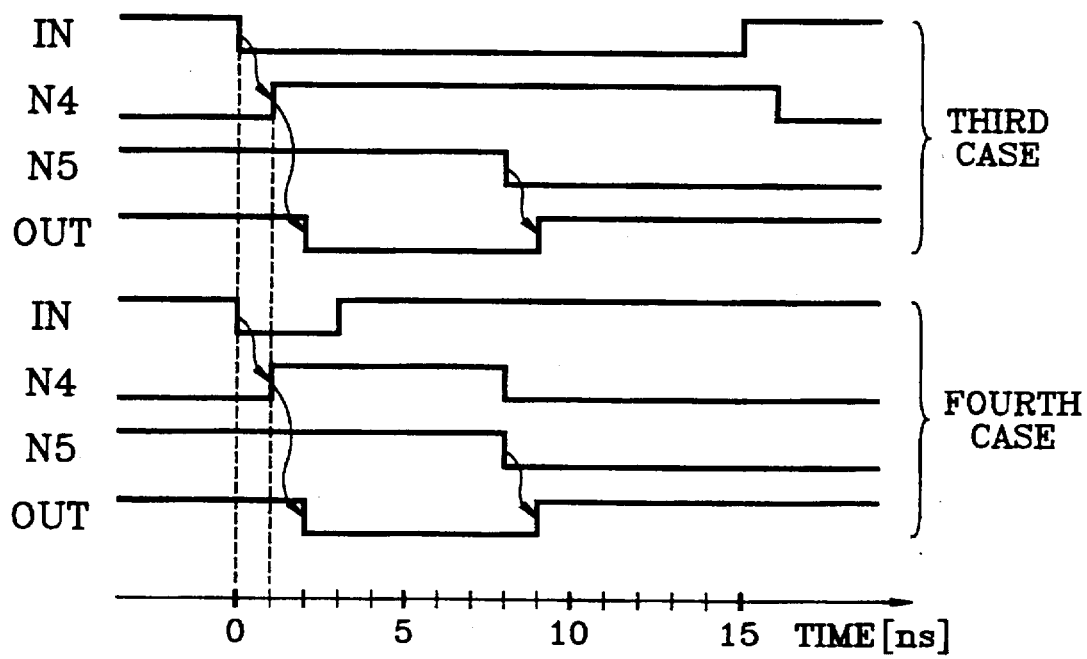
FIG. 6 is a waveform plot illustrating operation of the circuit of FIG. 4.

FIG. 6 is a waveform plot illustrating operation of the circuit of FIG. 4. Referring to FIGS. 3, 4 and 6, operation of the pulse generating circuit is described in detail, as follows.

When the input signal IN is in the "high" state, one of two input terminals of the NAND gate 29 of the pulse generating unit 220 is necessarily in the "low" state. Accordingly, the output terminal OUT is in the "high" state. Therefore node N4 is in the "low" state, and a node N5 is in the "high" state. When the input signal IN is changed from the "high" state to the "low" state, the "low" state of the node N4 is changed to the "high" state in 1 nanosecond. At this time, since the node N5 is in the "high" state, the output terminal OUT is changed to the "low" state in 2 nanoseconds after the "high" state of the input terminal IN is changed to the "low" state. Once the state of the output terminal OUT is changed to the "low" state, the output signal of the input unit 200 is always maintained in the "high" state regardless of the logic state of the input signal through the input terminal IN. Accordingly, if the "low" state of the input terminal IN persists for at least 2 nanoseconds, it is possible to always obtain the pulse signal having the requested width (which is 7 nanoseconds in the present invention and can be controlled by the number of the inverters of the delay unit). The above process is illustrated in the waveform of FIG. 6.

Figure 7:
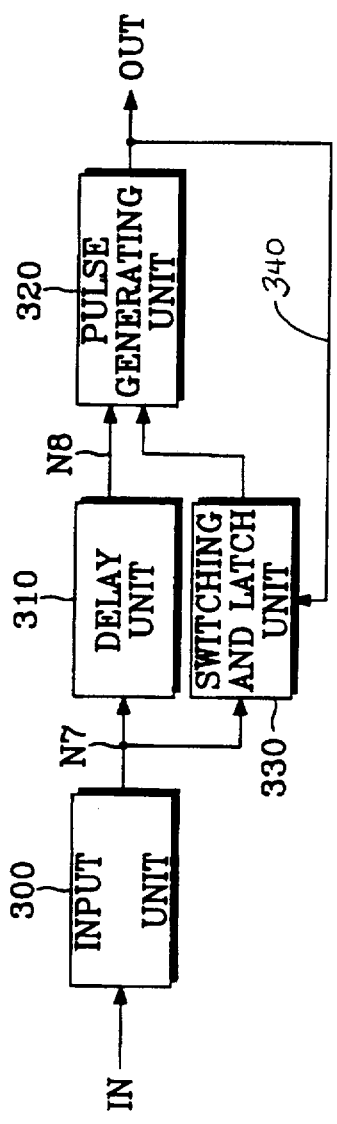
FIG. 7 is a block diagram of a pulse generating circuit according to another embodiment of the present invention.

FIG. 7 is a block diagram of a pulse generating circuit according to another aspect of the present invention. In the circuit of FIG. 7, the input terminal IN is connected to the input terminal of a input unit 300, and the output terminal of the input unit 300, i.e. node N7, is connected to the input terminal of the delay unit 310, and to an input terminal of a switching and latch unit 330. The output terminal of the delay unit 310 and the output terminal of the switching and latch unit 330 are connected to the input terminals of the pulse generating unit 320, respectively. The output terminal of the pulse generating unit 320 is connected to an output terminal OUT, and at the same time is coupled via feedback path 340 to provide a control signal to the switching and latch unit 330.

Figure 8:
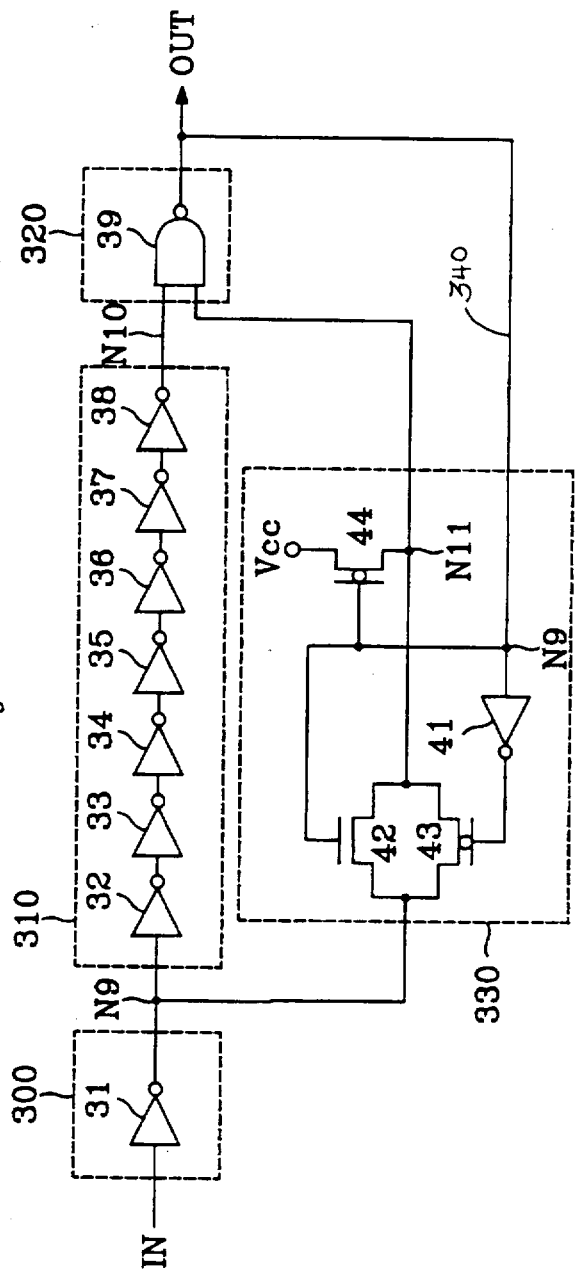
Figure 9:
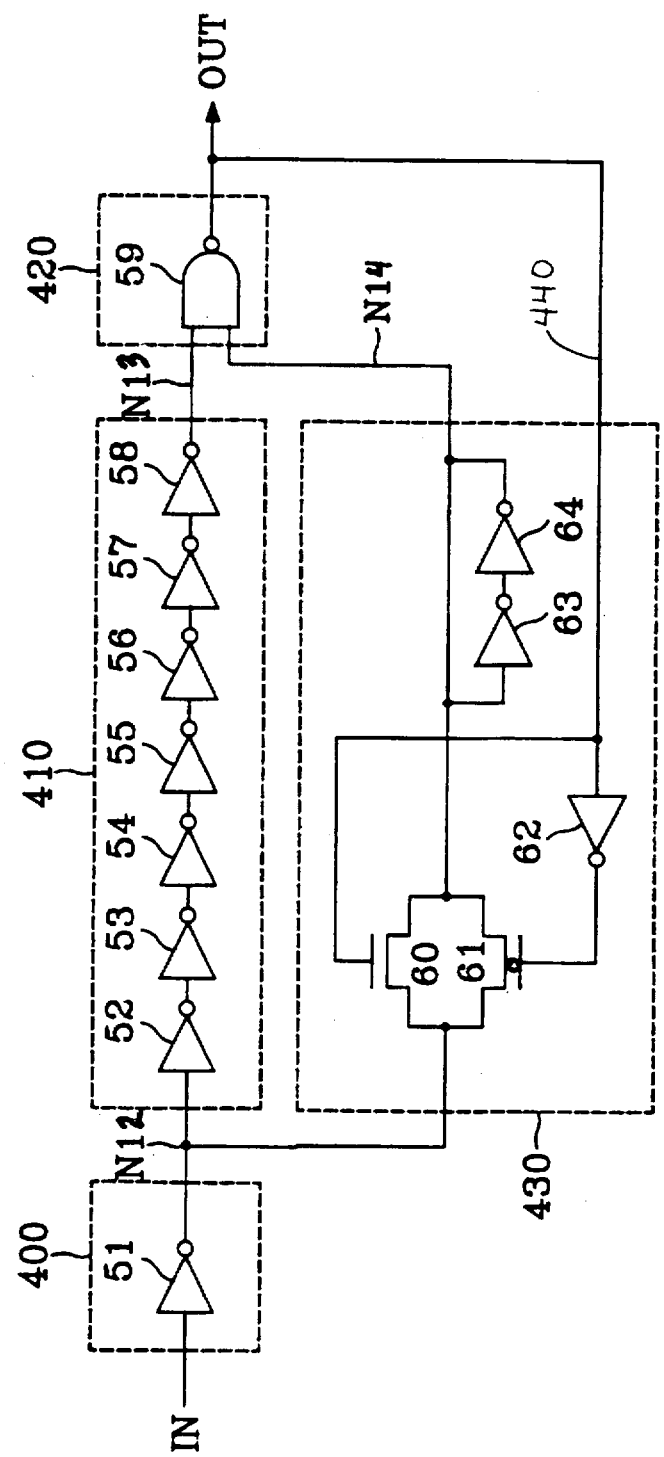

FIGS. 8 and 9 are views illustrating circuit diagrams of pulse generating circuits according to various embodiments of FIG. 7. Referring to FIG. 8, the input unit 300 comprises an inverter 31. The delay unit 310 consists of inverters 32–38 connected in series. The output terminal of the delay unit 310 is connected to one input terminal of the NAND gate 39. The output terminal of the pulse generating unit 320 is connected to the output terminal OUT and also is connected via feedback path 340 to provide a control signal to the switching and latch unit 330. The input unit 300 is connected at node N9 to an input to the switching and latch unit 330. The output of the switching and latch unit (N11) is connected to one input terminal of the NAND gate 39 of the pulse generating unit 320. The other input terminal of the NAND gate 39 is connected to the output terminal of the delay unit 310 at node N10.

A detailed description of the switching and latch unit 330 is as follows. The output signal OUT is connected to the input terminal of an inverter 41 and to a gate of an NMOS transistor 42. The output terminal of the inverter 41 is connected with a gate of a PMOS transistor 43. One terminal of the NMOS transistor 42 is connected with one terminal of a PMOS transistor 43, at the input to the switching and latch unit, ie. N9. The other terminal of the NMOS transistor 42 is connected with the other terminal of the PMOS transistor 43, together forming the switching and latch unit output at node N11, which in turn is connected with the other input terminal of the NAND gate 39 of the pulse generating unit 320. A gate of a second PMOS transistor 44 is connected with the output terminal OUT, a drain thereof is connected to one input terminal N11 of the pulse generating unit 320, and a source thereof is connected to a power source terminal Vcc. Thus N11 is pulled up when OUT goes low.

The operation of FIG. 8 is described next. The operation of FIG. 8 is similar to that of FIG. 4 above. Accordingly, when the input terminal IN is changed from the "high" state to the "low" state, thereby changing the "high" state of the terminal OUT to the "low" state thereof, the switching and latch unit 330 isolates the signal output from the node N9 during a delay time of the delay unit 310. This isolating operation is performed in a transmission gate consisting of NMOS transistor 42 and the PMOS transistor 43. The transmission gate is controlled by the output signal OUT via 340. Accordingly, the desired pulse signal is stably generated in the pulse generating circuit according to the present invention, even though the input terminal IN may change state again from the "low" state to the "high" state.

FIG. 9 is a view illustrating another embodiment of the pulse generating circuit according to the block diagram of FIG. 7. In FIG. 9, we see the now familiar arrangement of an input unit 400 comprising an inverter 51, and a delay unit 410 comprising inverters 52-58 disposed in series. The output unit comprises a NAND gate 59 as before. Here, a transmission gate comprises an NMOS transistor 60 and a PMOS transistor 61 connected in parallel to each other, the pair being connected between node N12 as an output terminal of the input unit 400 and a terminal N14 as one input terminal to NAND gate 59 of the pulse generating unit 420. Series inverters 63,64 drive N14 to a valid logic state when the transmission gate is off. The switching and latch unit 430 output at node N14 is coupled to one of the two input terminals of the pulse generating unit 420. The output signal OUT is coupled to transistor 60 gate and to inverter 62 so as to control the transmission gate. Operation of the circuit of FIG. 9 is similar to that of FIG. 8 described above.

Figure 10:
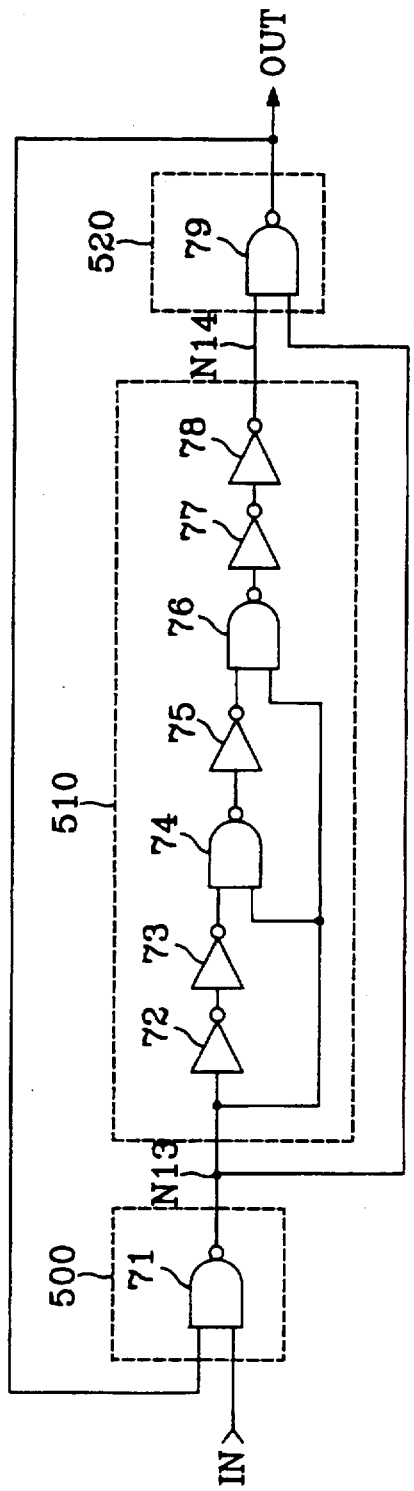
FIGS. 8, 9 and 10 are circuit diagrams of pulse generating circuits according to various embodiments of the circuit of FIG. 7.
Figure 5:
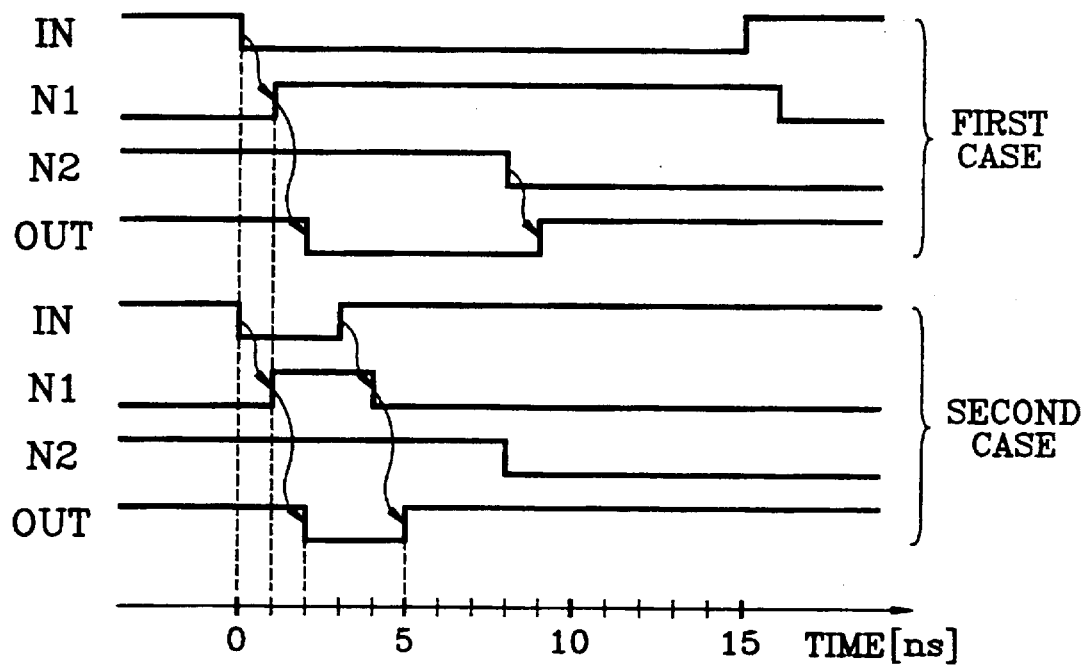
FIG. 5 is a waveform plot illustrating operation of the circuit of FIG. 2.

FIG. 10 is a view illustrating a pulse generating circuit according to another embodiment of the present invention. The pulse generating circuit of FIG. 10 is comprised of an input unit 500, a delay unit 510 and a pulse generating unit 520. The input unit 500 consists of an NAND gate 71 having two input terminals. Two input terminals of the NAND gate 71 are respectively connected with the input terminal IN and the output terminal OUT of the pulse generating unit 520. Inverters 72 and 73 of the delay unit 510 are connected in series, and the signal output from the inverter 73 is input to one terminal of the NAND gate 74. The other input terminal of the NAND gate 74 is connected with the node N13 being the output terminal of the input unit 500. The output terminal of the NAND gate 74 is connected with the input terminal of an inverter 75, and the output terminal of the NAND gate 76 through which the output signal of the inverter 75 and the node N13 are input is connected to inverters 77 and 78 which are in-series connected to each other. Also, the pulse generating unit 520 is comprised of an NAND gate 79 having two input terminals, and the input terminals of the pulse generating unit 520 are respectively connected with a node N14 being the output terminal of the delay unit 510 and the node N13 being the output terminal of the input unit 500. And, the output terminal of the pulse generating unit 520 is connected with the output terminal OUT. The operation of the pulse generating circuit according to another embodiment of FIG. 10 having the above construction is similar to those of FIGS. 8 and 9.

As discussed above, a pulse generating circuit according to the present invention in any of its various embodiments and equivalents thereof generates a pulse output signal having a predetermined width regardless of the pulse width of the input signal, and therefore is especially useful in high-frequency operation. While there have been illustrated and described what are presently considered to be preferred embodiments of the invention, it will be understood by those skilled in the art that various changes and modifications may be made, and equivalents may be substituted for elements thereof without departing from the true scope of the present invention.

What is claimed is:

1. A pulse generating circuit for use in a semiconductor memory device, comprising:

an input unit for receiving an input logic signal to trigger an output pulse of predetermined pulse width in response to a first transition of the input logic signal, the input unit including an output terminal coupled to a first node;

a delay unit coupled to the input unit to provide a predetermined delay period following a logic state transition at the first node, the delay unit including an output terminal coupled to a second node;

a pulse generating unit coupled to the second node for logic-gating an output signal of said delay unit together with the logic state at the first node, so as to generate an output pulse having a width corresponding to the predetermined delay period; and means for controllably coupling the first node to the pulse generating unit in response to the pulse output signal so as to isolate the input unit from the pulse generating unit until after completion of the output pulse.

2. A pulse generating circuit according to claim 1, wherein said means for controllably coupling the first node to the pulse generating circuit includes a transmission gate having an input terminal connected to the output terminal of said input unit at the first node, and having an output terminal connected to one input terminal of said pulse generating unit, and further having a control terminal coupled to the output of said pulse generating unit.

3. A pulse generating circuit according to claim 1 wherein the said coupling means further comprises means for maintaining a valid logic state at said output terminal of the transmission gate when the transmission gate is off.

4. A pulse generating circuit according to claim 3 wherein said means for maintaining a valid logic state at said output terminal of the transmission gate comprises an even number of inverters connected in series.

5. A pulse generating circuit according to claim 3 wherein said means for maintaining a valid logic state includes a pull-up transistor connected between a power source terminal Vcc and the output of the transmission gate.

* * * * *